(12) United States Patent
Murayama et al.

(10) Patent No.: US 10,079,133 B2
(45) Date of Patent: Sep. 18, 2018

(54) PLASMA PROCESSING DEVICE

(71) Applicant: ULVAC, INC., Chigasaki-shi (JP)

(72) Inventors: Takahide Murayama, Chigasaki (JP); Yasuhiro Morikawa, Chigasaki (JP); Toshiyuki Sakuishi, Chigasaki (JP)

(73) Assignee: ULVAC, INC., Chigasaki-Shi (JP)

( * ) Notice: Subject to any disclaimer, the term of this patent is extended or adjusted under 35 U.S.C. 154(b) by 0 days.

(21) Appl. No.: 15/314,772

(22) PCT Filed: Jan. 8, 2016

(86) PCT No.: PCT/JP2016/050510
§ 371 (c)(1),
(2) Date: Nov. 29, 2016

(87) PCT Pub. No.: WO2016/114232
PCT Pub. Date: Jul. 21, 2016

(65) Prior Publication Data
US 2017/0316917 A1 Nov. 2, 2017

(30) Foreign Application Priority Data
Jan. 16, 2015 (JP) .................................. 2015-006728

(51) Int. Cl.
*H01J 17/04* (2012.01)
*H05H 1/46* (2006.01)
(Continued)

(52) U.S. Cl.
CPC ............ *H01J 37/321* (2013.01); *H01J 17/04* (2013.01); *H01J 37/32568* (2013.01);
(Continued)

(58) Field of Classification Search
None
See application file for complete search history.

(56) References Cited

U.S. PATENT DOCUMENTS

| 5,897,713 A | 4/1999 | Tomioka et al. |
| 9,161,428 B2 | 10/2015 | Collins et al. |
| (Continued) | | |

FOREIGN PATENT DOCUMENTS

| CN | 102076162 | 5/2011 |
| JP | 9-82495 | 3/1997 |
| (Continued) | | |

OTHER PUBLICATIONS

Office Action from corresponding Chinese Appln. No. 2016800014904, dated May 31, 2017. English translation of the Search Report from the Office Action is attached.

(Continued)

*Primary Examiner* — Ashok Patel
(74) *Attorney, Agent, or Firm* — Grossman, Tucker, Perreault & Pfleger, PLLC (57) ABSTRACT

A plasma processing device includes: a chamber; a flat-plate-shaped first electrode; a first high frequency power supply; a helical second electrode disposed outside the chamber and disposed to face the first electrode with a quartz plate forming an upper lid of the chamber therebetween; and a gas introducing unit, in which a second high frequency power supply and a third high frequency power supply are configured to be electrically connected to the second electrode, the second high frequency power supply being configured to apply an AC voltage of a second frequency to the second electrode, the third high frequency power supply being configured to apply an AC voltage of a third frequency to the second electrode, and the third frequency being higher than the second frequency; and two types of AC voltages are configured to be simultaneously applied.

8 Claims, 6 Drawing Sheets

(51) Int. Cl.
*H05H 1/38* (2006.01)
*H05H 1/24* (2006.01)
*H01J 37/32* (2006.01)

(52) U.S. Cl.
CPC ............... *H05H 1/38* (2013.01); *H05H 1/46* (2013.01); *H01J 2237/0206* (2013.01); *H05H 2001/2468* (2013.01); *H05H 2001/469* (2013.01); *H05H 2001/4652* (2013.01)

(56) References Cited

U.S. PATENT DOCUMENTS

| | | | |
|---|---|---|---|
| 2003/0102811 A1* | 6/2003 | Leone | H01J 37/321 315/111.51 |
| 2004/0045669 A1 | 3/2004 | Okumura et al. | |
| 2010/0269980 A1* | 10/2010 | Nishimura | H01J 37/321 156/345.48 |
| 2011/0233170 A1* | 9/2011 | Yamazawa | H01J 37/321 216/67 |
| 2012/0073756 A1 | 3/2012 | Yamazawa | |
| 2012/0248066 A1* | 10/2012 | Yamazawa | H01J 37/321 216/68 |
| 2015/0284842 A1* | 10/2015 | Miyauchi | C23C 14/10 204/298.03 |

FOREIGN PATENT DOCUMENTS

| | | |
|---|---|---|
| JP | 2003-017473 | 1/2003 |
| JP | 2003-243369 | 8/2003 |
| JP | 2010-021590 | 1/2010 |
| JP | 2010-258324 | 11/2010 |
| JP | 2011-146721 | 7/2011 |
| JP | 2012-074464 | 4/2012 |
| JP | 2012-248578 | 12/2012 |

OTHER PUBLICATIONS

Notice of Allowance from corresponding Japanese Appln. No. 2016-543086, dated Aug. 30, 2016. English translation attached.
International Search Report from corresponding PCT Application No. PCT/JP2016/050510 dated Feb. 23, 2016. English translation attached.

* cited by examiner

SUPERIMPOSITION OF λb (2 MHz) AND λc (13.56 MHz)

FIG. 5A
(PRIOR ART)

13.56 MHz ICP

FIG. 5B
(PRIOR ART)

2 MHz ICP

PLASMA PROCESSING DEVICE

TECHNICAL FIELD

The present invention relates to a plasma processing device for stabilizing discharge at a low frequency.

Priority is claimed on Japanese Patent Application No. 2015-006728, filed Jan. 16, 2015, the content of which is incorporated herein by reference.

BACKGROUND ART

In recent years, in order to form a deep groove trench structure or a through hole having a high aspect ratio (a depth of a through hole/an opening diameter of a through hole) in a semiconductor substrate using a dry etching method, a plasma processing device including an opposite electrode formed from a helical antenna structure has been widely used (for example, Patent Literature 1).

Figure 5A:
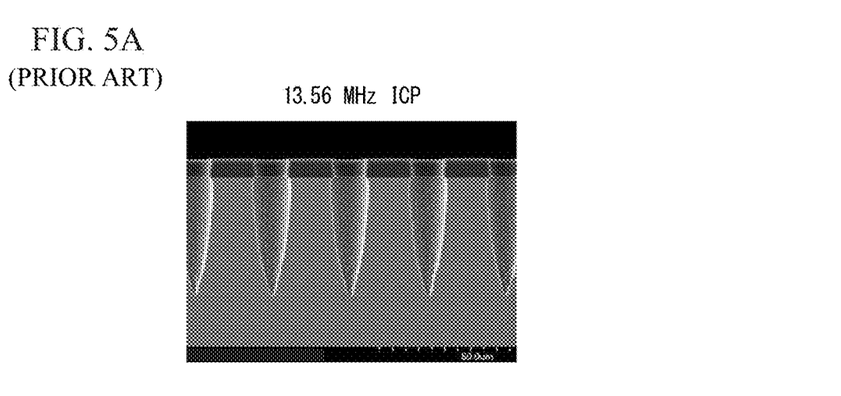
FIG. 5A shows a cross-sectional SEM picture of a non-through hole produced by a plasma processing device of the related art.
Figure 5B:
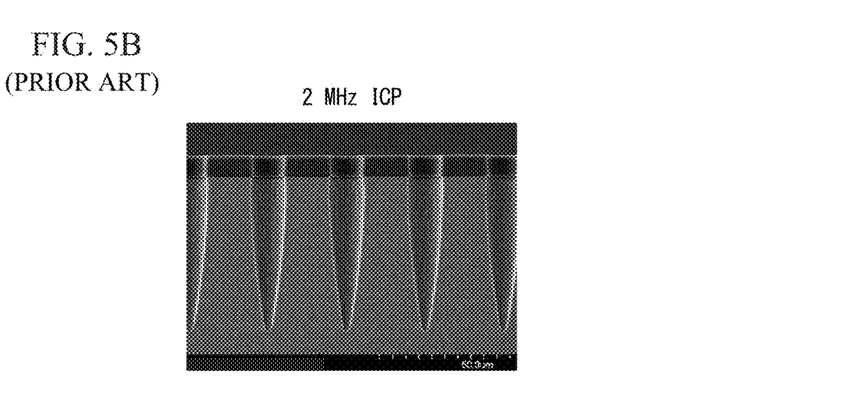
FIG. 5B shows a cross-sectional SEM picture of a non-through hole produced by the plasma processing device of the related art.

FIG. 5A and FIG. 5B are SEM pictures showing a cross-sectional shape of a non-through hole that is formed by applying AC voltages of different frequencies to an opposite electrode. FIG. 5A is the SEM picture when a frequency is 13.56 MHz and FIG. 5B is the SEM picture when a frequency is 2 MHz. Both FIG. 5A and FIG. 5B show results obtained by performing an etching process such that a diameter of a hole becomes 10 μm. It can be understood that deeper etching is possible, a variation of an inner diameter in the vicinity of an opening portion is smaller, and a more favorable hole shape is obtained in a case in which a frequency is 2 MHz (FIG. 5B) than a case in which a frequency is 13.56 MHz (FIG. 5A).

Figure 6:
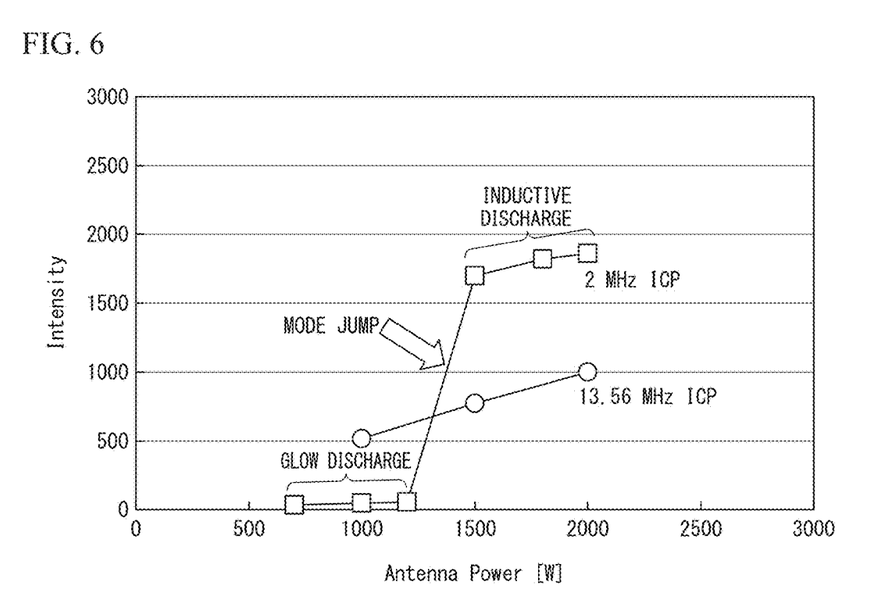
FIG. 6 is a graph showing a relation between power applied to the second electrode and an F radical light emission intensity.
Figure 7:
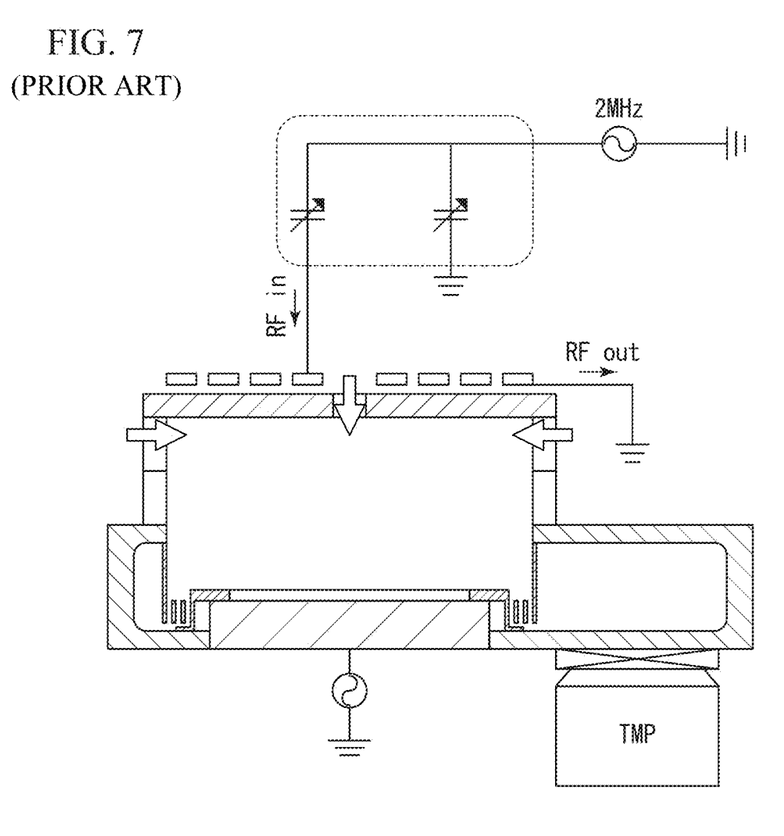
FIG. 7 is a cross-sectional view showing an example of the plasma processing device of the related art.

FIG. 6 is a graph showing spectroscopic measurement results of light emission of plasma generated when AC voltages of different frequencies are applied to an opposite electrode. The horizontal axis represents applied power [W] and the vertical axis represents an F radical light emission intensity. Here, "F radical" refers to a particle that is observed in plasma generated when a fluorine (F)-containing process gas is used. The following points are clarified based on the graph of FIG. 6. FIG. 6 shows results obtained when the plasma processing device of FIG. 7 is used. While FIG. 7 shows a configuration example in which a frequency of an AC power supply is 2 MHz, when an AC power supply whose frequency is 13.56 MHz is used, an AC power supply is replaced at the same position, and thus the results shown in FIG. 6 are obtained.

When a frequency is 2 MHz (the mark □), an electric discharge region transitions from a region whose F radical light emission intensity is low (a glow discharge region) to a region whose F radical light emission intensity is high (an inductive discharge region) according to an increase of applied power. In this case, there is a mode jump region in which discharge is switched between the two regions. Due to the mode jump region, there is a problem in that a manual adjustment time for about 1 minute is necessary in the inductive discharge region until the discharge is stabilized.

On the other hand, when a frequency is 13.56 MHz (the mark o), there is no mode jump region that is observed when the frequency is 2 MHz. Therefore, even if applied power increases and decreases, discharge is stably maintained and stable etching is possible. However, when the frequency is 13.56 MHz, an F radical light emission intensity is about half that of the inductive discharge region when the frequency is 2 MHz. Accordingly, there is a problem of an etching speed being halved and a processing time being doubled compared with a case when the frequency is 2 MHz.

The development of a plasma processing device having two advantages of enabling etching using an inductive discharge region in which "F radical" is significantly observed and enabling to avoid an influence of a mode jump region is expected.

PRIOR ART DOCUMENTS

Patent Documents

[Patent Literature 1] Japanese Unexamined Patent Application, First Publication No. 2012-248578

DISCLOSURE OF INVENTION

Problems to be Solved by the Invention

The present invention has been made in view of the above-described circumstances of the related art and provides a plasma processing device capable of stably using an excellent etching characteristic in an inductive discharge region with avoiding an influence by a mode jump region.

Means for Solving the Problems

A plasma processing device according to an aspect of the present invention includes a chamber configured to perform a plasma process of a subject to be processed inside of the chamber, the inside of the chamber being configured to be compressed; a flat-plate-shaped first electrode disposed in the chamber and on which the subject to be processed is mounted; a first high frequency power supply configured to apply a bias voltage of a first frequency to the first electrode; a helical second electrode disposed outside the chamber and disposed to face the first electrode with a quartz plate forming an upper lid of the chamber therebetween; and a gas introducing unit configured to introduce a fluorine-containing process gas from a gas introducing port into the chamber, the gas introducing port being disposed in the upper lid or the vicinity thereof, in which a second high frequency power supply and a third high frequency power supply are configured to be electrically connected to the second electrode, the second high frequency power supply being configured to apply an AC voltage of a second frequency to the second electrode, the third high frequency power supply being configured to apply an AC voltage of a third frequency to the second electrode, the third frequency being higher than the second frequency; and two types of AC voltages are configured to be simultaneously applied.

In the aspect described above, the second electrode may include the second electrode comprises a first part, a second part, and a third part, the first part being disposed at a helical central end and being configured to apply a high frequency from the second power supply, the second part being disposed at a helical outer peripheral end and being grounded, and the third part being disposed in an intermediate region positioned between the helical central end and the outer peripheral end and being configured to apply a high frequency from the third power supply.

In the aspect described above, the third part may be disposed in an outermost peripheral region that forms a helical shape within the intermediate region of the second electrode.

In the aspect described above, the helical second electrode may include a first circulating portion, a second circulating portion, and a connection portion, the first circulating portion having a specific radius, the second circulating portion having a radius that is greater than the specific radius, and the connection portion connecting the first circulating portion and the second circulating portion, and the helical second electrode may form a helical shape in which the first circulating portion, the second circulating portion, and the connection portion are repeatedly disposed.

In the aspect described above, the second frequency of the second power supply which is connected to the second electrode may be 2 MHz, and the third frequency of the third power supply which is connected to the second electrode may be 13.56 MHz.

Effects of the Invention

In the aspect of the present invention, with respect to a second electrode that is disposed to face a first electrode on which a subject to be processed is mounted, a high frequency power supply B configured to apply an AC voltage of a frequency $\lambda b$ and a high frequency power supply C configured to apply an AC voltage of a frequency $\lambda c$ that is higher than $\lambda b$ are electrically connected, and two types of AC voltages can be simultaneously applied. Accordingly, the second electrode is always in a state in which AC voltages of the different frequencies $\lambda b$ and $\lambda c$ are superimposed. Thus, even if one frequency $\lambda b$ supports an AC voltage of a frequency that causes a mode jump region, an AC voltage of a frequency that does not cause a mode jump region is selected for the other frequency $\lambda c$. By combining both of them, an influence of the mode jump region can be removed.

Therefore, the aspect of the present invention provides a plasma processing device that can stably use an excellent etching characteristic in an inductive discharge region without receiving an influence of the mode jump region.

EMBODIMENTS FOR CARRYING OUT THE INVENTION

A plasma processing device according to an embodiment of the present invention will be described below with reference to the drawings.

Figure 1:
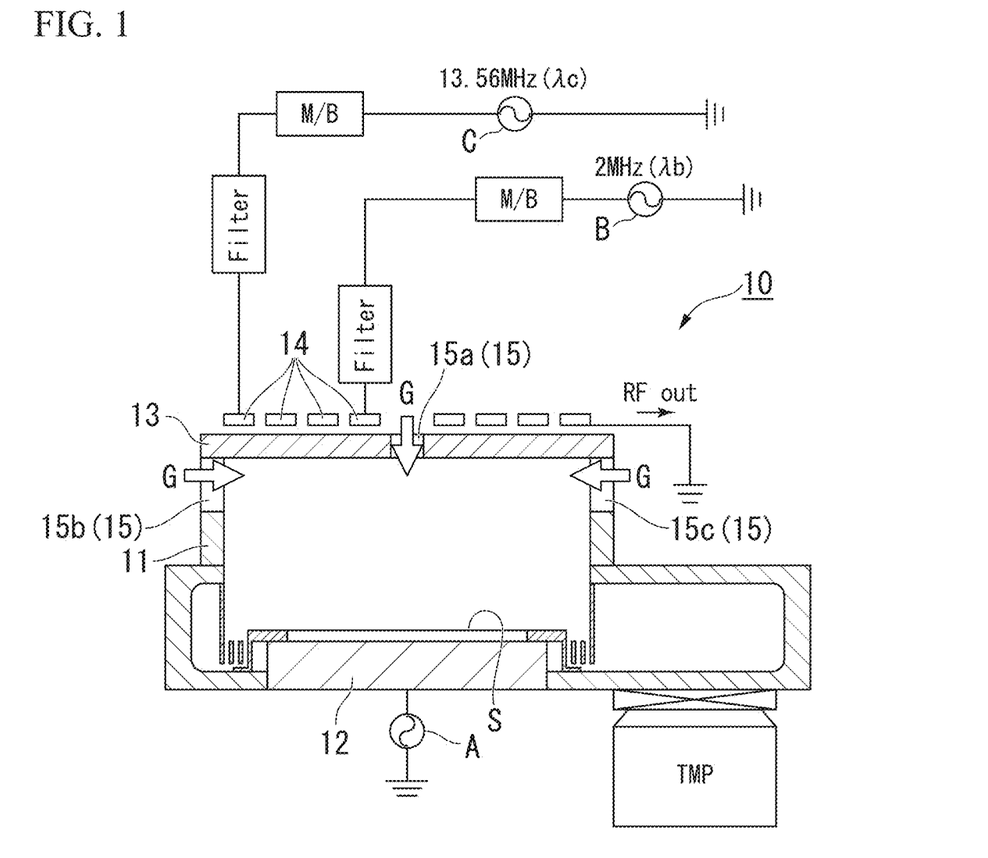
FIG. 1 is a cross-sectional view showing an example of a plasma processing device according to an embodiment of the present invention.

A plasma processing device 10 of FIG. 1 is a device configured to perform a plasma process with regard to a subject to be processed S in a chamber 11 whose pressure can be decompressed by, for example, an exhaust unit TMP.

The plasma processing device 10 of the present embodiment includes the chamber 11, a flat-plate-shaped first electrode (support unit) 12, a high frequency power supply A, an upper lid 13, a helical second electrode (antenna) 14, gas introducing ports (15a, 15b, and 15c), and a gas introducing unit (not shown). The first electrode (support unit) 12 is disposed in the chamber 11 and the subject to be processed S is mounted thereon. The high frequency power supply (first high frequency power supply) A can apply a bias voltage of a frequency (a first frequency) $\lambda a$ to the first electrode 12. The helical second electrode (antenna) 14 is disposed outside the chamber 11 and is disposed to face the first electrode 12 with a quartz plate forming the upper lid 13 of the chamber 11 interposed therebetween. The gas introducing unit introduces a fluorine (F)-containing process gas G into the chamber 11 from the gas introducing ports 15 (15a, 15b, and 15c) disposed in the upper lid 13 or the vicinity thereof (above the chamber 11).

In addition, in the plasma processing device 10, a high frequency power supply (second high frequency power supply) B configured to apply an AC voltage of a frequency (second frequency) $\lambda b$ (2 MHz) and a high frequency power supply (third high frequency power supply) C configured to apply an AC voltage of a frequency (third frequency) $\lambda c$ (13.56 MHz) that is higher than $\lambda b$ are electrically connected to the second electrode 14. The high frequency power supply B applies an AC voltage of the frequency $\lambda b$ (2 MHz) to the second electrode 14. The high frequency power supply C applies an AC voltage of a frequency $\lambda c$ (13.56 MHz) that is higher than $\lambda b$ to the second electrode 14. In other words, the plasma processing device 10 of the present embodiment is configured to simultaneously apply two types of AC voltages to the second electrode 14. In this case, as shown in FIG. 1, a configuration in which respective AC voltages are applied to the second electrode 14 through a matching box (M/B) and a filter is preferable.

According to the above configuration, the second electrode 14 can always remain in a state in which AC voltages of the different frequencies $\lambda b$ and $\lambda c$ are superimposed. Therefore, even if one frequency $\lambda b$ supports an AC voltage of a frequency that causes a mode jump region, an AC voltage of a frequency that does not cause a mode jump region can be selected for the other frequency $\lambda c$. Through the combination of both, an influence of the mode jump region can be removed. Therefore, the plasma processing device 10 according to the present embodiment enables to stably use an excellent etching characteristic in an inductive discharge region without receiving an influence of the mode jump region.

The term "subject to be processed S" in the present embodiment includes, for example, silicon, and silicon dioxide.

The term "fluorine (F)-containing process gas G" in the present embodiment includes, for example, SF6, C4F8, C3F8, CF4, CHF3, BF3, NF3, and SiF4.

Figure 2:
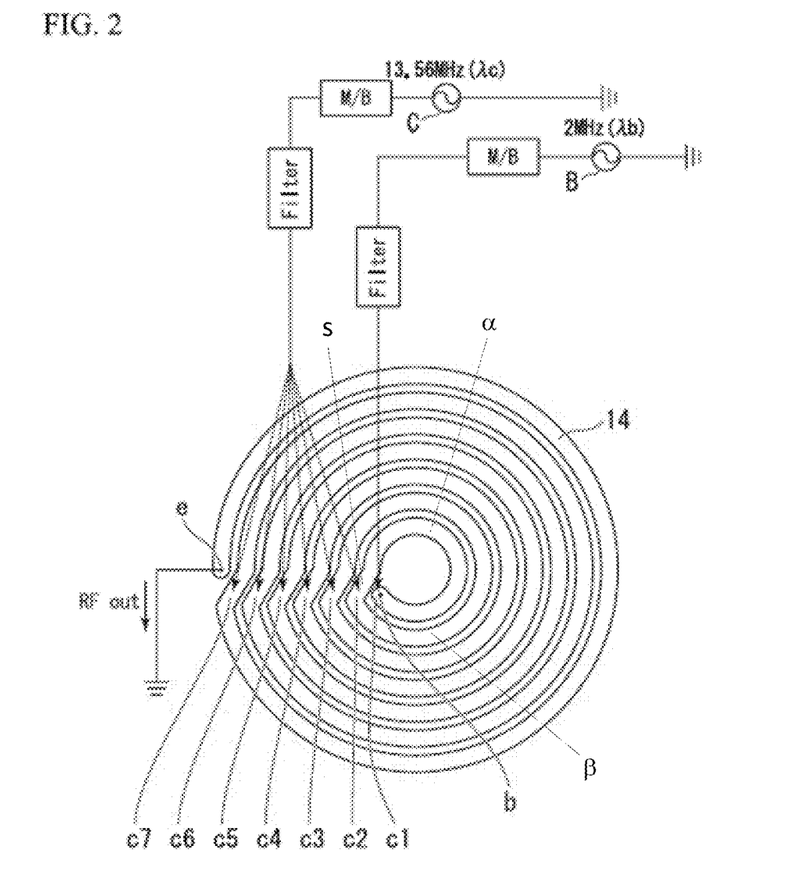
FIG. 2 is a plan view showing an example of a connection position of a power supply B and a power supply C with respect to a second electrode.

FIG. 2 is a plan view showing an example of a connection position of a power supply B and a power supply C with respect to the second electrode.

As shown in FIG. 2, in the second electrode 14, a part (a first part) b is disposed at a helical central end, a part (a second part) e is disposed at a helical outer peripheral end, and a part (a third part) c (c1 to c7) is disposed in an intermediate region that is positioned between the helical central end and the outer peripheral end. The part b applies an AC voltage of a high frequency from the power supply B to the second electrode 14. The part e is grounded. The part c applies an AC voltage of a high frequency from the power supply C to the second electrode 14.

For example, by applying an AC voltage of a high frequency from the power supply C to any position of c1 to c7, a state in which AC voltages of the different frequencies λb and λc are superimposed in the second electrode 14 can be controlled. For example, it is possible to perform delicate adjustment according to a type or a flow rate of a process gas and a pressure of a state in which plasma is generated, and to control so that an influence of the mode jump region is removed for a long period of time. A stable mass production process is accordingly obtained.

In particular, a configuration in which the part c is disposed in an outermost peripheral region (a region from c7 to e) that forms a helical shape within the intermediate region of the second electrode 14 is preferable. According to such a configuration, process plasma generation according to the low frequency λb that determines an etching process characteristic can be performed in most of the second electrode 14 from c7 to c1 (the part b). Accordingly, a plasma generation region according to the high frequency λc that only performs auxiliary plasma generation in a process can be remained at an outer edge of the second electrode 14 from c7 to e. Simultaneously, a configuration in which "a high impedance region suitable for discharge according to the low frequency λb" and "a low impedance region suitable for discharge according to the high frequency λc" are easily ensured on the second electrode 14 can be obtained.

The helical second electrode 14 preferably has a configuration in which a circulating portion (a first circulating portion) α, a circulating portion (a second circulating portion) β, and a connection portion S are repeatedly disposed and form a helical shape. The circulating portion α has a specific radius. The circulating portion β has a radius greater than the specific radius. The connection portion S connects the circulating portion α and the circulating portion β. According to such a configuration, concentration of a current flowing through an inner line (the circulating portion α) at the connection portion S is suppressed. Therefore, in the plasma processing device including the second electrode 14 functioning as a high frequency antenna shown in FIG. 2, damage of a part of the second electrode 14 due to the local heating of the second electrode 14 is suppressed. In addition, a density of plasma formed in the chamber 11 is suppressed from being higher in regions below the connection portion than the other regions. The number of circulating portions α, circulating portions β, and connection portions S that are repeatedly disposed is not particularly limited.

A configuration in which the frequency λb of the power supply B connected to the second electrode 14 is 2 [MHz], and the frequency λc of the power supply C connected to the second electrode 14 is 13.56 [MHz] is desirable. According to such a configuration, it is possible to obtain a configuration in which a function for always stably discharging without mode jump is ensured by using λc.

Figure 3A:
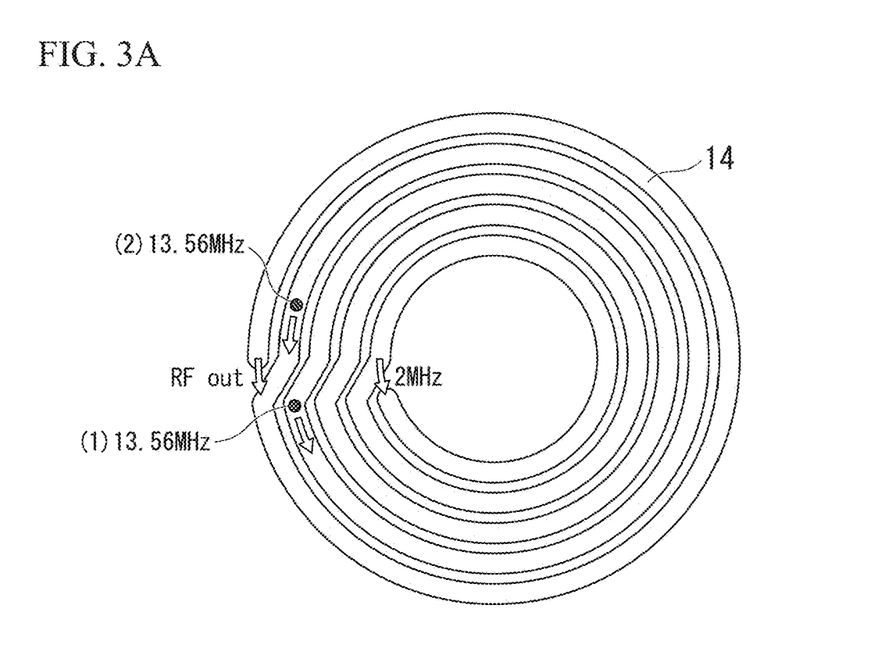
FIG. 3A is a plan view showing another example of a connection position of the power supply B and the power supply C with respect to the second electrode.
Figure 3B:
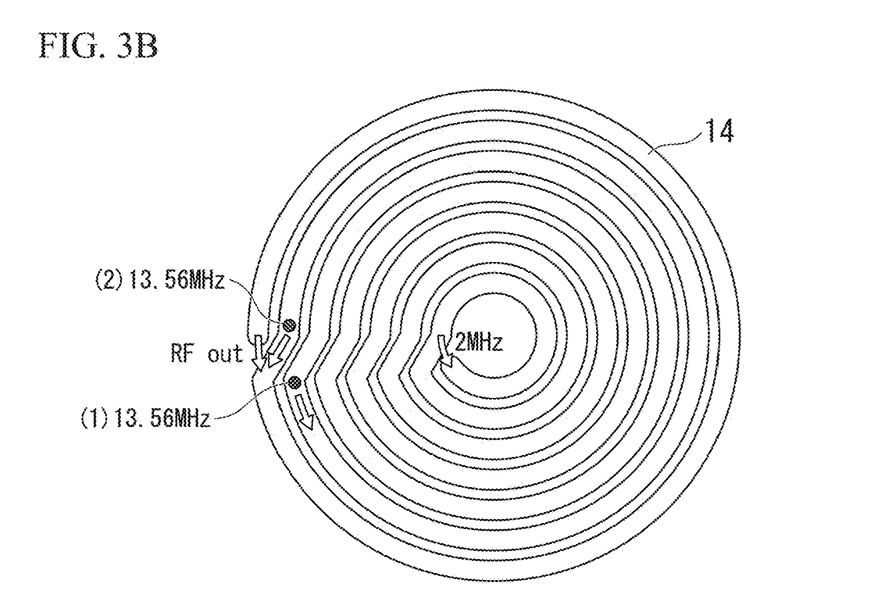
FIG. 3B is a plan view showing another example of a connection position of the power supply B and the power supply C with respect to the second electrode.

FIG. 3A and FIG. 3B are plan views showing examples of a connection position of the power supply B and the power supply C with respect to the second electrode.

As shown in FIG. 3A, the second electrode in the present embodiment may have a configuration in which a region in which there is no second electrode 14 occupies a large area at a center portion of the helical second electrode 14. According to such a configuration, when an in-plane distribution of etched surfaces is optimized, if process plasma generation at the center portion is undesirable, it is possible to implement ICP discharge with high efficiency and a small RF loss, particularly, since a length of the second electrode is reduced.

As shown in FIG. 3B, the second electrode in the present embodiment may have a configuration in which a region in which there is no second electrode 14 occupies a small area at the center portion of the helical second electrode 14. According to such a configuration, it is possible to support a case in which process plasma generation at the center portion is desirable when in-plane distribution of etched surfaces is optimized.

Figure 4:
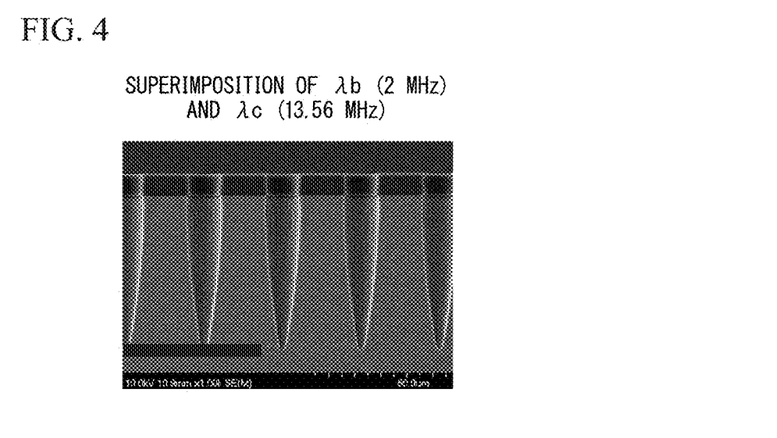
FIG. 4 shows a cross-sectional SEM picture of a non-through hole produced by the plasma processing device of FIG. 1.

FIG. 4 shows a cross-sectional SEM picture of a non-through hole produced by the plasma processing device of FIG. 1.

It was confirmed that, when the plasma processing device of the present embodiment is used, it is possible to produce a non-through hole having a sharp and deeply depressed shape without receiving an influence of the mode jump region, similarly to a plasma processing device of the related art.

Therefore, according to the plasma processing device of the present embodiment, it is possible to stably use an excellent etching characteristic in the inductive discharge region without receiving an influence of the mode jump region. Thus, the present embodiment contributes to construction of manufacturing lines with high productivity.

While the plasma processing device of the present invention has been described above, the present invention is not limited thereto, and can be appropriately changed without departing from the scope of the invention.

INDUSTRIAL APPLICABILITY

The present invention can be broadly applied to plasma processing devices.

DESCRIPTION OF THE REFERENCE SYMBOLS

A High frequency power supply (first high frequency power supply) B High frequency power supply (second high frequency power supply) C High frequency power supply (third high frequency power supply) G Process gas M/B Matching box S Subject to be processed TMP Exhaust unit λa Frequency (first frequency) λb Frequency (second frequency) λc Frequency (third frequency) 10 Plasma processing device 11 Chamber 12 First electrode (support unit) 13 Upper lid 14 Second electrode (antenna) 15 (15a, 15b, and 15c) Gas introducing port b Part (first part) e Part (second part) c Part (third part) a Circulating portion (first circulating portion) β Circulating portion (second circulating portion) S Connection portion.

What is claimed is:
1. A plasma processing device comprising:
a chamber configured to perform a plasma process of a subject to be processed inside of the chamber, the inside of the chamber configured to be compressed;
a flat-plate-shaped first electrode disposed in the chamber and on which the subject to be processed is mounted;
a first high frequency power supply configured to apply a bias voltage of a first frequency to the first electrode;
a helical second electrode disposed outside the chamber and disposed to face the first electrode with a quartz plate forming an upper lid of the chamber therebetween; and a gas introducing unit configured to introduce a fluorine-containing process gas from a gas introducing port into the chamber, the gas introducing port being disposed in the upper lid or the vicinity thereof, wherein a second high frequency power supply and a third high frequency power supply are configured to be electrically connected to the second electrode, the second high frequency power supply being configured to apply an AC voltage of a second frequency to the second electrode, the third high frequency power supply being configured to apply an AC voltage of a third frequency to the second electrode, the third frequency being higher than the second frequency;

the AC voltages of both the second and third frequencies are configured to be simultaneously applied; and the second electrode comprises a first part, a second part, and a third part, the first part being disposed at a helical central end and being configured to apply a high frequency from the second power supply, the second part being disposed at a helical outer peripheral end and being grounded, and the third part being disposed in an intermediate region positioned between the helical central end and the outer peripheral end and being configured to apply a high frequency from the third power supply.

2. The plasma processing device according to claim 1, wherein the third part is disposed in an outermost peripheral region that forms a helical shape within the intermediate region of the second electrode.

3. The plasma processing device according to claim 2, wherein the helical second electrode comprises a first circulating portion, a second circulating portion, and a connection portion, the first circulating portion having a specific radius, the second circulating portion having a radius that is greater than the specific radius, and the connection portion connecting the first circulating portion and the second circulating portion, and the helical second electrode forms a helical shape in which the first circulating portion, the second circulating portion, and the connection portion are repeatedly disposed.

4. The plasma processing device according to claim 3, wherein the second frequency of the second power supply which is connected to the second electrode is 2 MHz, and the third frequency of the third power supply which is connected to the second electrode is 13.56 MHz.

5. The plasma processing device according to claim 2, wherein the second frequency of the second power supply which is connected to the second electrode is 2 MHz, and the third frequency of the third power supply which is connected to the second electrode is 13.56 MHz.

6. The plasma processing device according to claim 1, wherein the helical second electrode comprises a first circulating portion, a second circulating portion, and a connection portion, the first circulating portion having a specific radius, the second circulating portion having a radius that is greater than the specific radius, and the connection portion connecting the first circulating portion and the second circulating portion, and the helical second electrode forms a helical shape in which the first circulating portion, the second circulating portion, and the connection portion are repeatedly disposed.

7. The plasma processing device according to claim 6, wherein the second frequency of the second power supply which is connected to the second electrode is 2 MHz, and the third frequency of the third power supply which is connected to the second electrode is 13.56 MHz.

8. The plasma processing device according to claim 1, wherein the second frequency of the second power supply which is connected to the second electrode is 2 MHz, and the third frequency of the third power supply which is connected to the second electrode is 13.56 MHz.

* * * * *